(12) United States Patent
Yeh et al.

(10) Patent No.: US 8,551,812 B2
(45) Date of Patent: Oct. 8, 2013

(54) MANUFACTURING METHOD OF RIGID AND FLEXIBLE COMPOSITE PRINTED CIRCUIT BOARD

(75) Inventors: Ming Yi Yeh, New Taipei (TW); Jia Lin Liu, New Taipei (TW); Chung Shih Wu, New Taipei (TW)

(73) Assignee: Unitech Printed Circuit Board Corp., New Taipei (TW)

( * ) Notice: Subject to any disclaimer, the term of this patent is extended or adjusted under 35 U.S.C. 154(b) by 106 days.

(21) Appl. No.: 13/352,647

(22) Filed: Jan. 18, 2012

(65) Prior Publication Data
US 2012/0187078 A1 Jul. 26, 2012

(30) Foreign Application Priority Data
Jan. 20, 2011 (TW) .................................. 100102056

(51) Int. Cl.
*H01L 21/00* (2006.01)
(52) U.S. Cl.
USPC ........... 438/106; 438/107; 438/108; 438/109; 438/110; 438/111; 438/112
(58) Field of Classification Search
None
See application file for complete search history.

(56) References Cited

U.S. PATENT DOCUMENTS

| 2008/0314618 A1* | 12/2008 | Shimoosako et al. | ........ 174/250 |
| 2010/0012362 A1* | 1/2010 | Abe et al. | ........ 174/259 |
| 2010/0200898 A1* | 8/2010 | Lin et al. | ........ 257/294 |

FOREIGN PATENT DOCUMENTS

| EP | 2034810 A1 | 3/2009 |
| TW | I304318 B | 12/2008 |

* cited by examiner

*Primary Examiner* — Duy Deo
(74) *Attorney, Agent, or Firm* — Muncy, Geissler, Olds & Lowe, PLLC

(57) ABSTRACT

In a manufacturing method of a printed circuit board, a rigid substrate having a rigid-board metal layer is provided, an open slot is formed on the rigid substrate, and a flexible substrate is installed in the open slot, and the flexible substrate and the rigid substrate are securely bonded, and an increased-layer circuit layer is formed after electric circuits are manufactured on the rigid-board and flexible-board metal layers, and stacked on the rigid substrate and on an adjacent block where the flexible substrate is coupled to the rigid substrate, and an electric circuit is manufactured, and the increased-layer circuit layer is provided for electrically connecting and conducting the rigid and flexible substrates to overcome the issue of alignment errors.

9 Claims, 4 Drawing Sheets

MANUFACTURING METHOD OF RIGID AND FLEXIBLE COMPOSITE PRINTED CIRCUIT BOARD

BACKGROUND OF THE INVENTION

1. Field of the Invention

The present invention relates to a printed circuit board and a manufacturing method, and more particularly to the rigid and flexible composite printed circuit board and the manufacturing method thereof.

2. Description of Related Art

Speed and density are always factors that drive the promotion and development of high technologies, so that production costs can be reduced, and user requirements can be satisfied. Since electronic products and mobile communication products tend to be developed with a light, thin, short, compact, multifunctional, highly reliable and low-priced design, and these products are developed at a speed of approximately three to five years per generation. With this trend, finding a way of laying the wires on a plane in limited space and extending them to a 3D space is a revolutionary topic for circuit designs of the electronic products.

In addition, a flexible printed circuit board (FPC board) has the light, thin, curved, 3D spatial wiring, low-voltage, low power consumption features, and the products can be designed and changed according to the space available and folded or stacked to prevent electrostatic interference, and the components of the products can be manufactured with a high density to reduce the volume and weight of the product. As a result, the flexible printed circuit board gradually replaces the rigid printed circuit board, and it is used extensively in the different fields including satellites, medical treatments, and industrial and commercial applications. In the applications for foldable electronic products, the flexible printed circuit board and the rigid printed circuit board can be combined, so that the casing of the product can be dynamically lifted, slid or folded without affecting the electric connection of the electronic products. For example, the flexible-board and the rigid-board of the flexible-rigid board are securely combined with each other as disclosed in R.O.C. Pat. No. I304318 entitled "Flexible substrate with a conductor pattern horizontally arranged thereon and non-flexible substrate with rigidity", wherein at least a portion of the flexible substrate is exposed, and an insulating layer is covered onto the flexible substrate and the non-flexible substrate, and vias of the conductor pattern are formed on the insulating layer to produce the flexible substrate, and conductive holes are formed by plating to achieve the wiring of the conductor pattern, and the insulating layer is deposited and accumulated on the insulating layer to lay circuits for circuit connections, but the flexible and rigid materials (which are used for making the flexible substrate and the non-flexible substrate with rigidity) may require different equipments and manufacturing processes, so that when the two materials are hot pressed and combined, different sizes may result, and the issue of alignment errors of the electric circuit may occur. As a result, the stability of the product will be lowered, which is a major difficulty of the manufacture.

In summation of the description, the inventor of the present invention designed an image capturing device, a dust removal system and a vibrating dust removal method to overcome the shortcomings of the prior art, and enhance the industrial application.

SUMMARY OF THE INVENTION

Therefore, it is a primary objective of the invention to provide a rigid and flexible composite printed circuit board and a manufacturing method thereof to maintain a good conductivity between the circuit layers of the rigid and soft boards, so as to improve the yield rate, product quality and market competiveness.

Another objective of the present invention is to provide a way of effectively overcoming the issue of alignment errors for bonding the flexible and rigid substrates.

A further objective of the present invention is to provide a way of effectively reducing the stacking area of the increased-layer circuit layer and the flexible substrate.

To achieve the aforementioned objectives, the present invention provides a manufacturing method of rigid and flexible composite printed circuit, and the method comprises the steps of: providing a rigid substrate, wherein the rigid substrate comprises a rigid-board dielectric layer and a rigid-board metal layer, and the rigid-board metal layer is disposed on at least one side of the rigid-board dielectric layer; forming at least one slot on the rigid substrate; installing a flexible substrate in the open slot, and securely bonding the flexible substrate between the flexible substrate and the rigid substrate, wherein the flexible substrate comprises a flexible-board dielectric layer and a flexible-board metal layer, and the flexible-board metal layer is disposed on at least one side of the flexible-board dielectric layer, and the flexible substrate and the rigid substrate are securely bonded with each other; and manufacturing electric circuits on the rigid substrate and the flexible substrate to form rigid and soft boards electric circuit layers simultaneously.

To achieve the aforementioned objectives, the present invention provides a manufacturing method of rigid and flexible composite printed circuit, and the method further comprises the steps of forming an increased-layer circuit layer on the finished rigid substrate and flexible substrate of the circuit layer, and stacking the increased-layer circuit layer on the rigid substrate and on an adjacent block disposed on the flexible substrate and coupled to the rigid substrate; manufacturing the electric circuit on the increased-layer circuit layer to form an increased-layer circuit, and using a conductive blind hole for electrically coupling the rigid substrate and the flexible substrate with each other via an electric signal.

An increased-layer circuit layer is formed on the circuit layers of the rigid and soft boards and stacked on the rigid substrate, and on an adjacent block where the flexible substrate is coupled to the rigid substrate, and the increased-layer circuit layer comprises an increased-layer dielectric layer and an increased-layer metal layer.

To achieve the aforementioned technical measure, the present invention provides a method further comprising the steps of manufacturing an electric circuit on the increased-layer circuit layer, and using the conductive blind hole for electrically coupling and conducting the rigid substrate and the flexible substrate.

DETAILED DESCRIPTION OF THE PREFERRED EMBODIMENTS

The technical contents and characteristics of the image capturing device and its image processing method in accordance with the present invention will be apparent with the detailed description of a preferred embodiment accompanied with related drawings as follows. For simplicity, same numerals are used in the following preferred embodiment to represent respective same elements.

Figure 1:
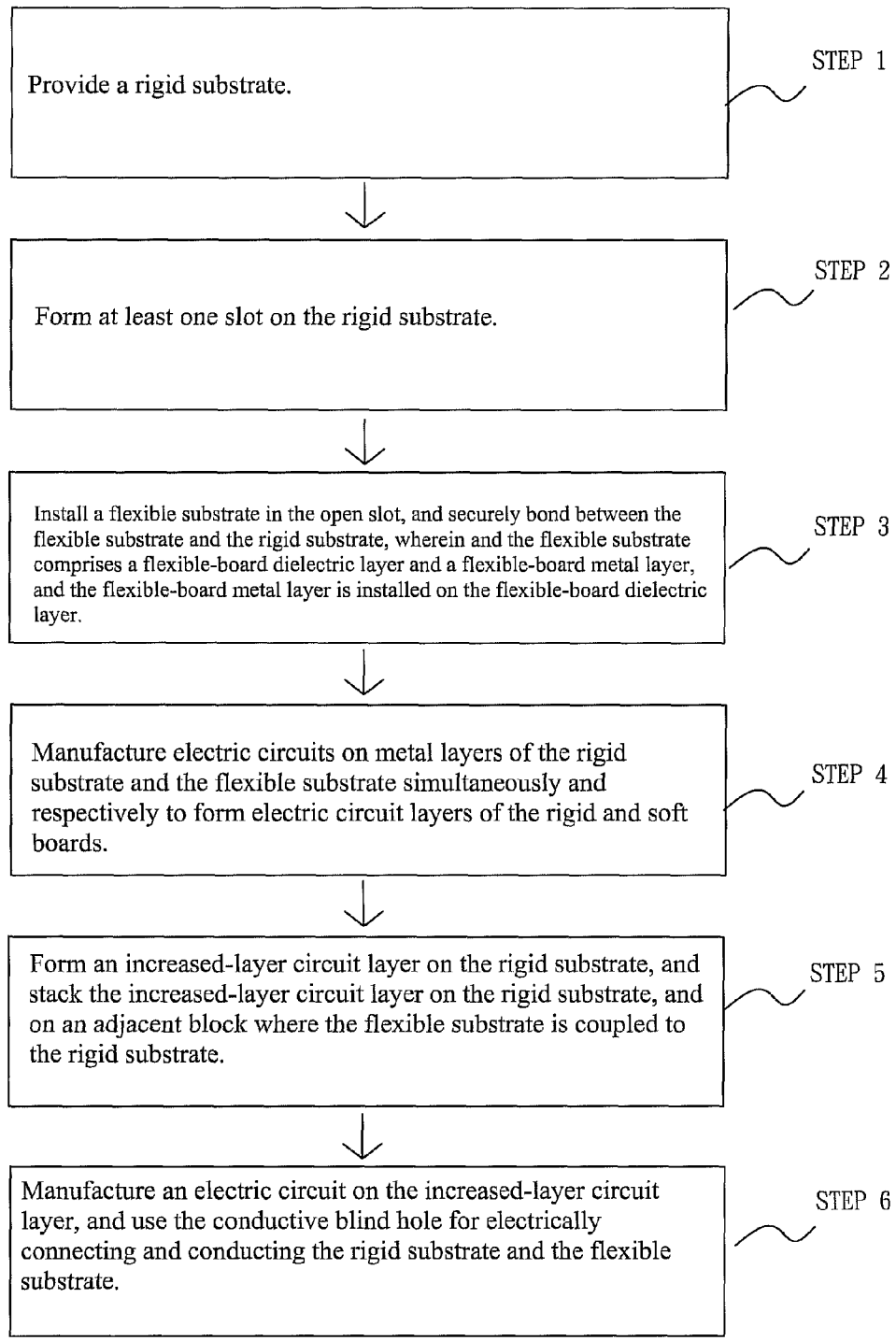
FIG. 1 is a flow chart of a manufacturing method of the present invention.

With reference to FIG. 1 for a flow chart of a manufacturing method of manufacturing method of a rigid and flexible composite printed circuit board in accordance with the present invention, the manufacturing method comprises the following steps:

Step 1: Provide a rigid substrate.

Step 2: Form at least one slot on the rigid substrate.

Step 3: Install a flexible substrate in the open slot, and securely bond between the flexible substrate and the rigid substrate, wherein and the flexible substrate comprises a flexible-board dielectric layer and a flexible-board metal layer, and the flexible-board metal layer is installed on the flexible-board dielectric layer.

Step 4: Manufacture electric circuits on metal layers of the rigid substrate and the flexible substrate simultaneously and respectively to form electric circuit layers of the rigid and soft boards.

Step 5: Form an increased-layer circuit layer on the rigid substrate, and stack the increased-layer circuit layer on the rigid substrate, and on an adjacent block where the flexible substrate is coupled to the rigid substrate, and the increased-layer circuit layer comprises an increased-layer dielectric layer and an increased-layer metal layer.

Step 6: Manufacture an electric circuit on the increased-layer circuit layer, and use the conductive blind hole for electrically connecting and conducting the rigid substrate and the flexible substrate.

Figure 2A:
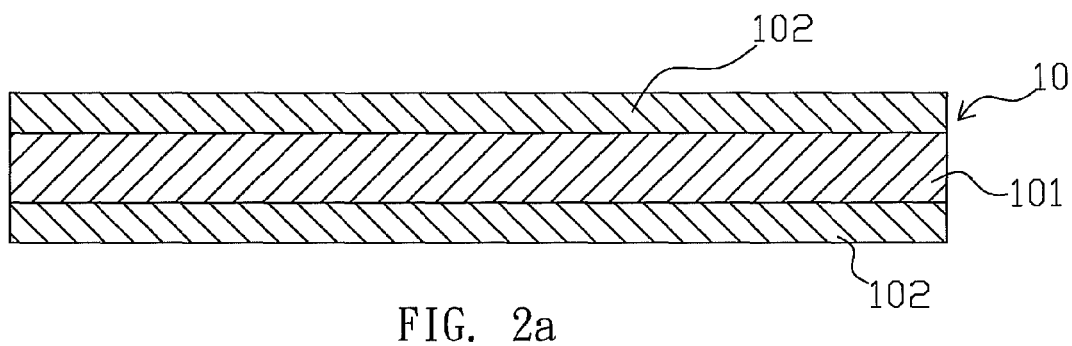
FIGS. 2a~2g are schematic views of manufacturing a rigid and flexible composite printed circuit board of the present invention.

With reference to FIGS. 2a~2g for the schematic views of manufacturing a rigid and flexible composite printed circuit board of the present invention when the aforementioned method of the present invention is adopted, a rigid substrate 10 as shown in FIG. 2a is provided, and the rigid substrate 10 comprises a rigid-board dielectric layer 101 and a rigid-board metal layer 102, and the rigid-board metal layer 102 is disposed on at least one side of the rigid-board dielectric layer 101 (wherein the rigid-board metal layer of this preferred embodiment is disposed on both upper and lower sides of the rigid-board dielectric layer separately).

Figure 2B:
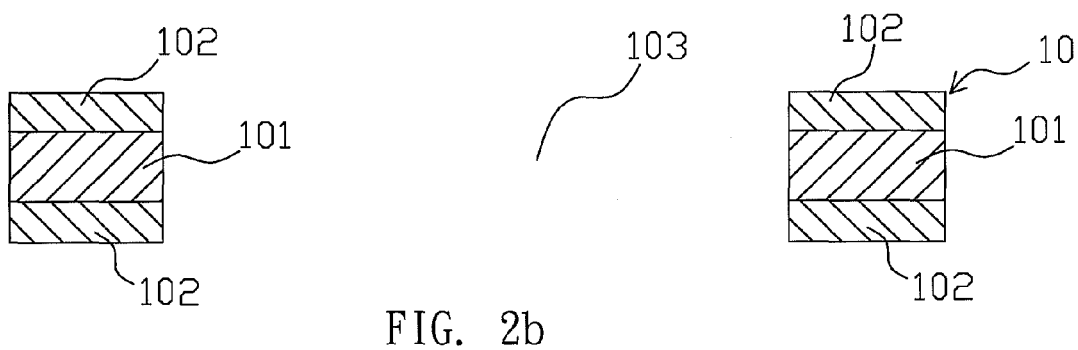

In FIG. 2b, the rigid substrate 10 has at least one hollow open slot 103 formed thereon.

Figure 2C:
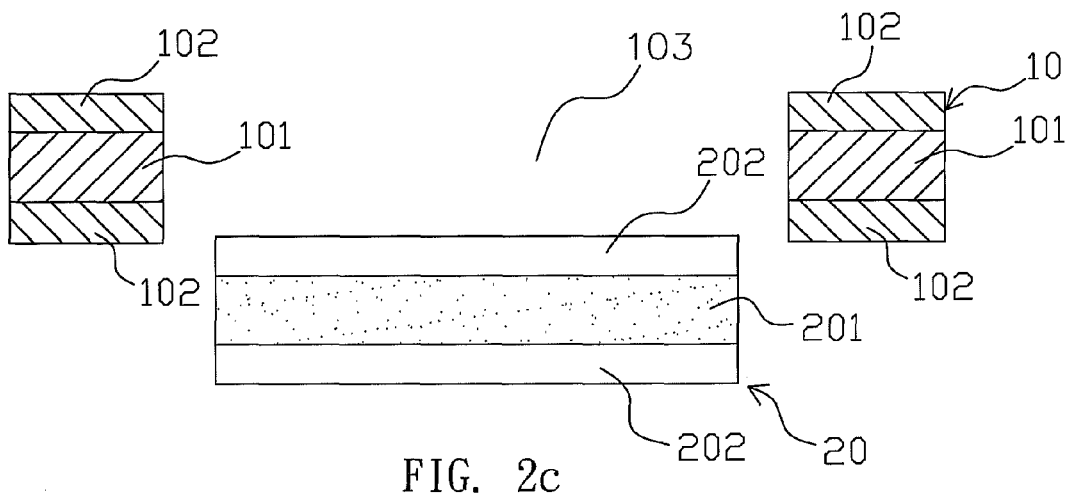

In FIG. 2c, a flexible substrate 20 is installed in the open slot 103, and the flexible substrate 20 comprises a flexible-board dielectric layer 201 and a flexible-board metal layer 202, and the flexible-board metal layer 202 is disposed on at least one side of the flexible-board dielectric layer 201 (wherein the flexible-board metal layer of this preferred embodiment is disposed on both upper and lower sides of the flexible-board dielectric layer separately).

Figure 2D:
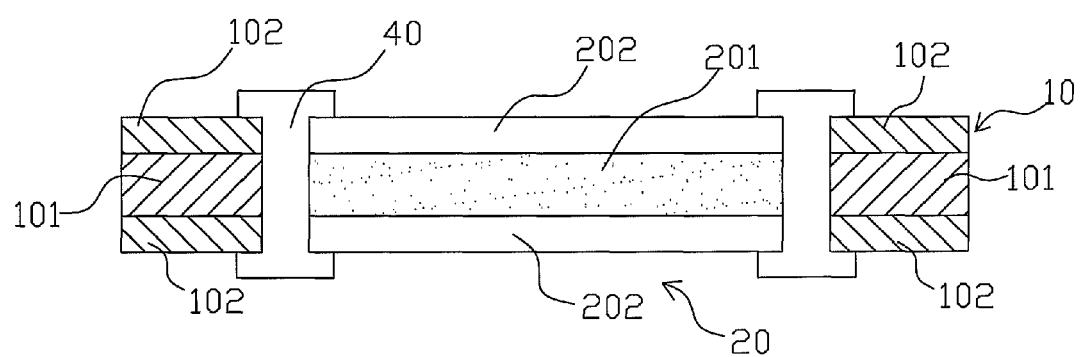

In FIG. 2d, the flexible substrate 20 and the rigid substrate 10 are securely bonded (wherein a fixing adhesive 40 is coated uniformly for the bonding in this preferred embodiment).

Figure 2E:
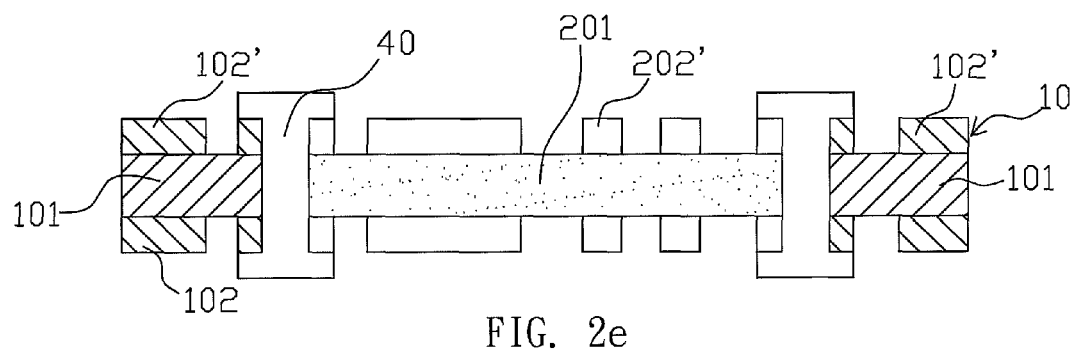

In FIG. 2e, electric circuits are manufactured on the rigid substrate 10 and the flexible substrate 20 simultaneously to form a rigid-board circuit layer 102' and a flexible-board circuit layer 202'.

Figure 2F:
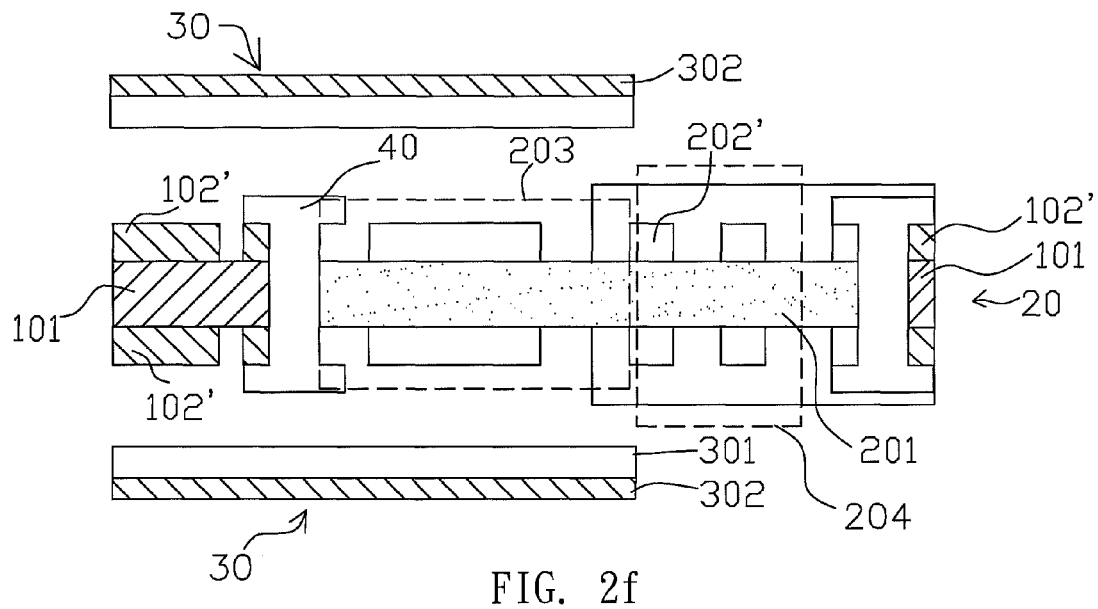

In FIG. 2f, the rigid substrate 10 has an increased-layer circuit layer 30 formed therein and stacked on an adjacent block 203 where the flexible substrate 20 is coupled to the rigid substrate 10, and the increased-layer circuit layer 30 comprises an increased-layer dielectric layer 301 and an increased-layer metal layer 302, and the flexible substrate 20 has a flexible curved block 204 exposed from the open slot 103, wherein the curved block 204 has a flexible wiring property.

Figure 2G:
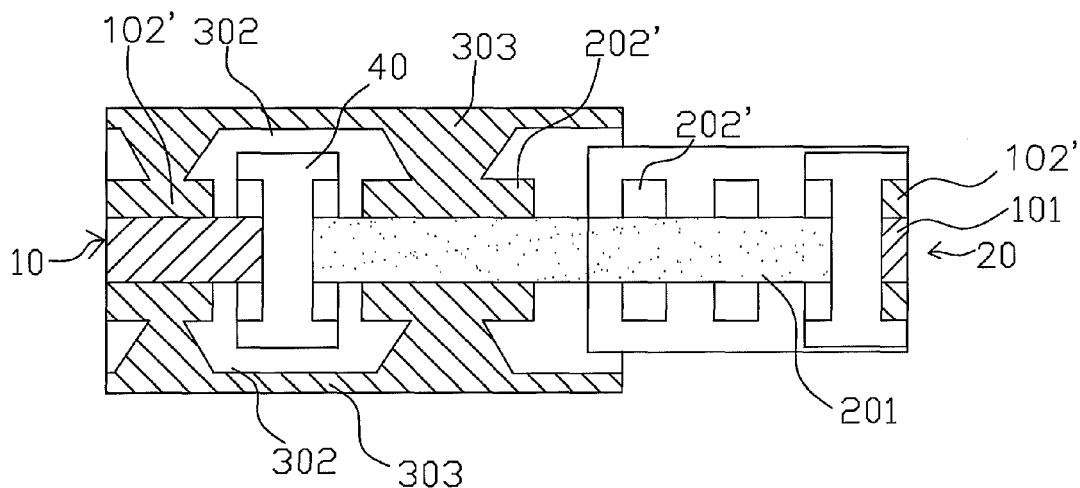

In FIG. 2g, when the increased-layer circuit is manufactured on the increased-layer circuit layer 30, the conductive blind hole 303 is provided for electrically connecting and conducting the rigid-board circuit layer 102' and the flexible-board circuit layer 202' of the rigid substrate 10 and the flexible substrate 20 via electric signals.

The rigid-board dielectric layer 101 is made of a non-flexible material such as a fiberglass film, a curable resin film or any other appropriate resin film Wherein, the rigid-board metal layer 102 is attached onto the rigid-board dielectric layer 101 by a copper cladding method or an electroplating method.

Wherein, the flexible-board dielectric layer 201 is made of a flexible material such as polyimide, or a flexible polyester, a flexible polyether, a flexible polyurethane, or any other appropriate material for the flexible-board dielectric layer.

Wherein, the flexible-board metal layer 202 is attached onto the flexible-board dielectric layer 201 by a copper cladding method or an electroplating method.

Wherein, the rigid substrate 10 has at least one slot 103 formed thereon, and the open slot 103 can be formed by a punching process, a milling process, a laser cutting process, or any other appropriate manufacturing method.

Wherein, a flexible substrate 20 is installed in the open slot 103 of the rigid substrate 10. In the method of bonding the flexible substrate 20 and the rigid substrate 10 in accordance of this preferred embodiment, the flexible substrate 20 is placed into the open slot 103 first, and then a fixing adhesive 40 is coated uniformly at a joint of the flexible substrate 20 and the rigid substrate 10, or a film is attached onto a joint of the flexible substrate 20 and the rigid substrate 10 for securely bonding them together.

Wherein, the electric circuits of the rigid-board metal layer 102, the flexible-board metal layer 202, and the increased-layer metal layer 302 are manufactured by the processes of applying a photoresist, exposing, developing, and etching the photoresist.

Wherein, the curved block 204 of the flexible substrate 20 exposed from the open slot 103 has a flexible and 3D spatial wiring property to achieve the effects of reducing the volume and the weight.

In summation of the description above, the manufacturing method of a rigid and flexible composite printed circuit board of the present invention overcomes the shortcomings of the prior art and complies with patent application requirements, and thus is duly filed for patent application.

What is claimed is:

1. A manufacturing method of a rigid and flexible composite printed circuit board, comprising the steps of:
providing a rigid substrate;
forming at least one slot on the rigid substrate;
installing a flexible substrate in the open slot, and securely bonding the flexible substrate between the flexible substrate and the rigid substrate;
manufacturing electric circuits on the rigid substrate and the flexible substrate to form rigid and soft boards electric circuit layers simultaneously;
forming an increased-layer circuit layer on the finished rigid substrate and flexible substrate of the circuit layer, and stacking the increased-layer circuit layer on the rigid substrate, and on an adjacent block where the flexible substrate is coupled to the rigid substrate;
manufacturing the electric circuit on the increased-layer circuit layer to form an increased-layer circuit, and using a conductive blind hole for electrically coupling the rigid substrate and the flexible substrate with each other via an electric signal.

2. The manufacturing method of a rigid and flexible composite printed circuit board according to claim 1, wherein the rigid substrate comprises a rigid-board dielectric layer and a rigid-board metal layer, and the rigid-board metal layer is disposed on at least one side of the rigid-board dielectric layer.

3. The manufacturing method of a rigid and flexible composite printed circuit board according to claim 2, wherein the rigid-board metal layer is formed on at least one side of the rigid-board dielectric layer by an electroplating method or a copper cladding method.

4. The manufacturing method of a rigid and flexible composite printed circuit board according to claim 1, wherein the flexible substrate comprises a flexible-board dielectric layer and a flexible-board metal layer, and the flexible-board metal layer.

5. The manufacturing method of a rigid and flexible composite printed circuit board according to claim 4, wherein the flexible-board metal layer is formed on at least one side of the flexible-board dielectric layer by the electroplating method or the copper cladding method.

6. The manufacturing method of a rigid and flexible composite printed circuit board according to claim 1, further comprising the step of attaching a film at a connecting position of the flexible substrate and the rigid substrate to securely fix the flexible substrate into the open slot, after the flexible substrate is installed in the open slot.

7. The manufacturing method of a rigid and flexible composite printed circuit board according to claim 1, further comprising the step of coating a fixing adhesive at a connecting position of the flexible substrate and the rigid substrate to securely fix the flexible substrate into the open slot, after the flexible substrate is installed in the open slot.

8. The manufacturing method of a rigid and flexible composite printed circuit board according to claim 1, wherein the open slot is formed by a punching, a milling, or a laser cutting process.

9. The manufacturing method of a rigid and flexible composite printed circuit board according to claim 1, wherein the circuit formed on the metal layer is manufactured by processes of applying a photoresist, exposing, developing, and etching the photoresist.

* * * * *